United States Patent
Nemouchi et al.

(10) Patent No.: US 12,402,542 B2
(45) Date of Patent: Aug. 26, 2025

(54) JOSEPHSON TRANSISTOR

(71) Applicants: Commissariat à l'Energie Atomique et aux Energies Alternatives, Paris (FR); UNIVERSITE GRENOBLE ALPES, Saint Martin d'Heres (FR)

(72) Inventors: Fabrice Nemouchi, Grenoble (FR); Frederic Gustavo, Grenoble (FR); François Lefloch, Grenoble (FR); Tom Vethaak, Grenoble (FR)

(73) Assignees: Commissariat à l'Energie Atomique et aux Energies Alternatives, Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 416 days.

(21) Appl. No.: 17/823,330

(22) Filed: Aug. 30, 2022

(65) Prior Publication Data

US 2023/0060817 A1    Mar. 2, 2023

(30) Foreign Application Priority Data

Aug. 31, 2021  (FR) ...................................... 21 09113

(51) Int. Cl.
*H10N 60/10* (2023.01)
*H10N 60/01* (2023.01)
(Continued)

(52) U.S. Cl.
CPC ....... *H10N 60/128* (2023.02); *H10N 60/0912* (2023.02); *H10N 60/12* (2023.02); *H10N 60/805* (2023.02)

(58) Field of Classification Search
CPC ............. H10N 60/805; H10N 60/0912; H10D 62/149; H10D 84/013; H01L 21/324
See application file for complete search history.

(56) References Cited

U.S. PATENT DOCUMENTS

| | | | |
|---|---|---|---|
| 2015/0118487 A1* | 4/2015 | Wolden | ............... C03C 17/3464 |
| | | | 204/192.15 |
| 2016/0285079 A1* | 9/2016 | Liquet | ................... H01M 4/525 |

(Continued)

FOREIGN PATENT DOCUMENTS

| | | |
|---|---|---|
| FR | 3 088 483 A1 | 5/2020 |
| JP | 59-103389 A | 6/1984 |
| WO | WO 2009/006679 A1 | 1/2009 |

OTHER PUBLICATIONS

French Preliminary Search Report issued May 30, 2022 in French Application 21 09113, filed on Aug. 31, 2021 (with English Translation of Categories of cited documents and Written Opinion), 17 pages.

(Continued)

*Primary Examiner* — Edward Chin
(74) *Attorney, Agent, or Firm* — Oblon, McClelland, Maier & Neustadt, L.L.P.

(57) ABSTRACT

A Josephson transistor, this transistor comprising a source and a drain each comprising an electric charge reservoir in electrical contact with a semiconductor layer. Each reservoir comprises a lower face and a side face both buried inside the semiconductor layer, The lower face of each reservoir extends mainly in an intermediate plane parallel to the plane of a support, this intermediate plane being located between a lower plane and an upper plane that define the semiconductor layer. The side face of each reservoir extends mainly perpendicular to the plane of the support, this side face facing the corresponding side face of the other reservoir and being separated from this corresponding side face of the other reservoir by a channel located under a gate of this transistor.

11 Claims, 2 Drawing Sheets

(51) Int. Cl.
*H10N 60/12* (2023.01)
*H10N 60/80* (2023.01)

(56) References Cited

U.S. PATENT DOCUMENTS

| | | | |
|---|---|---|---|
| 2018/0122810 A1* | 5/2018 | Han | H10B 12/033 |
| 2020/0161422 A1* | 5/2020 | Nemouchi | H10D 64/668 |
| 2020/0287119 A1 | 9/2020 | Black et al. | |
| 2023/0060817 A1* | 3/2023 | Nemouchi | H10N 60/12 |

OTHER PUBLICATIONS

Chu, W. K. et al. "Implanted noble gas atoms as diffusion markers in silicide formation" Thin Solid Films, 25 (1975) 10 pages.

* cited by examiner

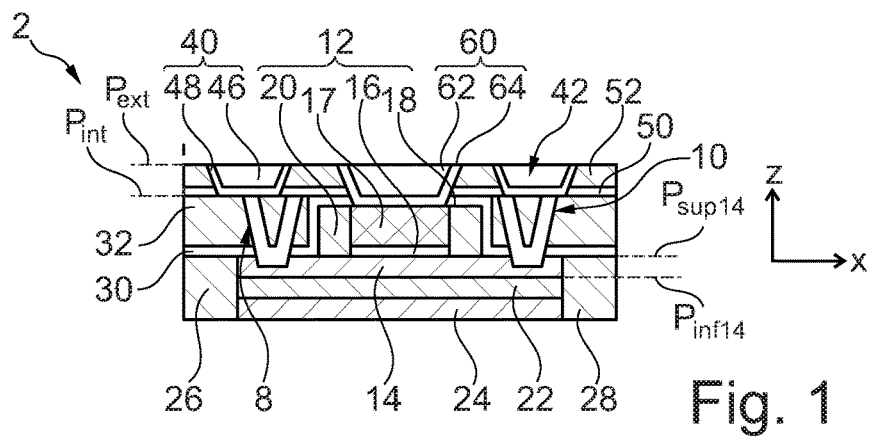
Fig. 1
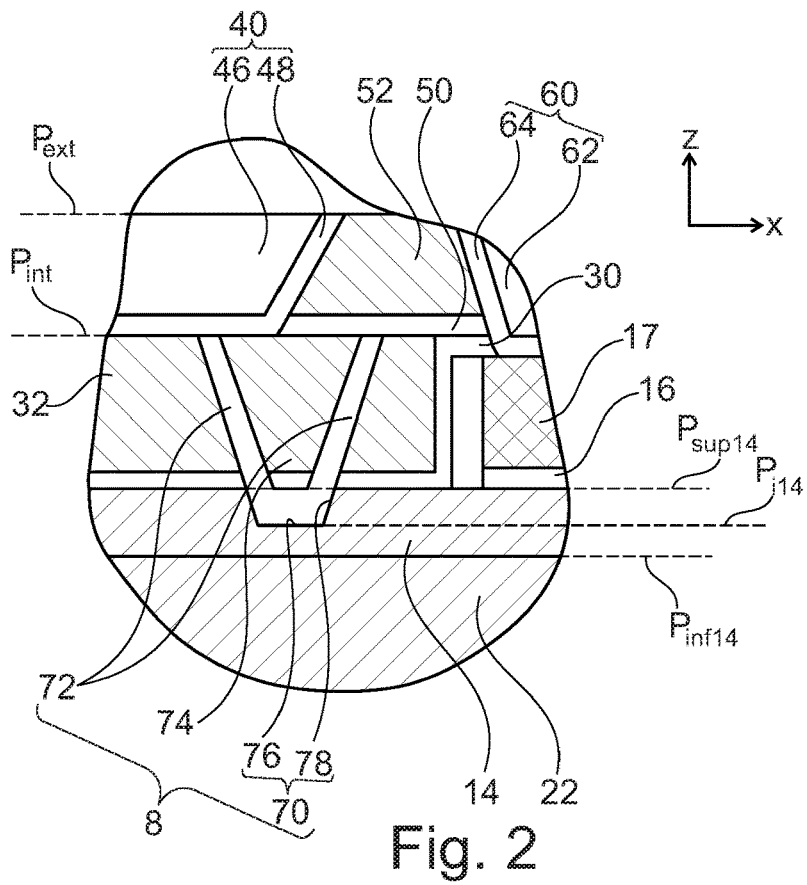
Fig. 2
Fig. 3
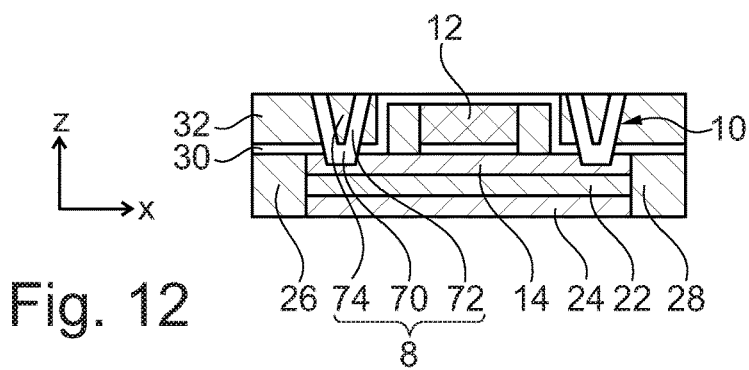
Fig. 12

JOSEPHSON TRANSISTOR

The invention relates to a Josephson transistor and to a method for fabricating this transistor.

Such Josephson transistors are used for example in the field of quantum computers. They use the Josephson effect. In physics, the Josephson effect manifests itself through the occurrence of a non-dissipative current (supercurrent) between two superconducting materials separated by a thin layer formed of a material that is insulating or conductive but not superconducting. The amplitude of this supercurrent depends on the quantum phase difference characterizing the two superconducting electrodes.

For example, application US2020287119A1 describes, with reference to FIG. 5, such a Josephson transistor. In that application, the Josephson junction of the transistor is created by juxtaposing a first superconducting charge reservoir, a silicon channel located under a gate and a second superconducting charge reservoir in one and the same plane.

The invention aims to propose such a Josephson transistor with improved performance.

Another subject of the invention is a method for fabricating the claimed Josephson transistor.

The invention will be better understood on reading the following description, which is given solely by way of non-limiting example, with reference to the drawings, in which:

FIG. 1 is a schematic, vertical sectional view of a Josephson transistor,

FIG. 2 is a partial, schematic, vertical sectional view of a source of the transistor from FIG. 1, FIG. 3 is a flowchart of a method for fabricating the transistor from FIG. 1;

FIGS. 4 to 12 are schematic, vertical sectional illustrations of various states of the fabrication of the transistor during the implementation of the method from FIG. 3.

Figure 4:
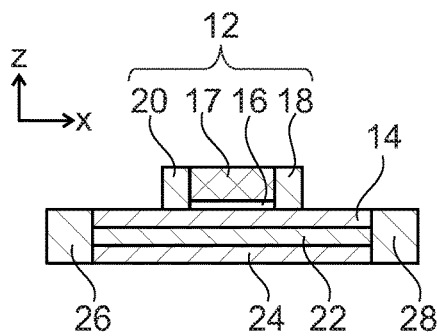
Figure 5:
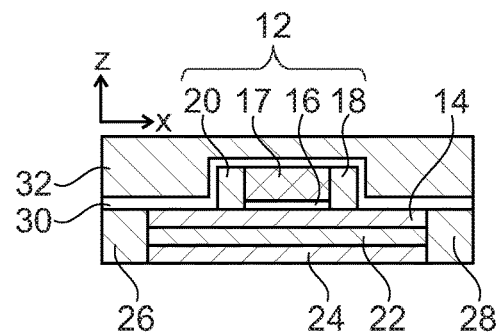
Figure 6:
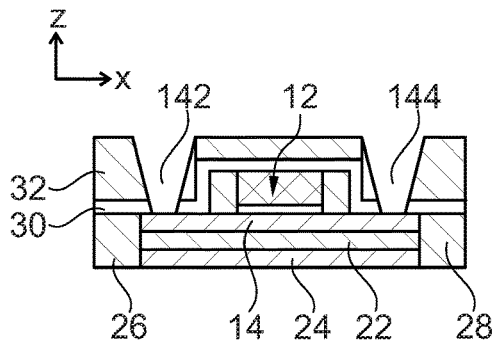
Figure 7:
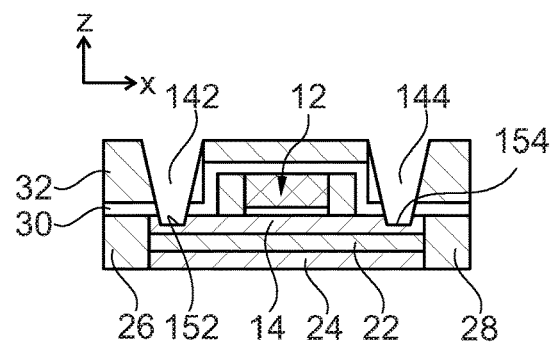

In this description, the definitions and conventions used in this text are introduced in section I. Next, detailed exemplary embodiments are described in section II with reference to the figures. In section III, variants of these embodiments are presented. Lastly, the advantages of the various embodiments are presented in section IV.

Section 1—Definitions and Conventions:

In the figures, the same references have been used to designate elements that are the same. Hereinafter in this description, features and functions that are well known to those skilled in the art are not described in detail.

In the figures, the thicknesses of the various layers are not to scale in order to make them easier to read. In these figures, the various layers extend mainly horizontally. The horizontal directions are represented by two directions X and Y of an orthogonal reference system XYZ. The direction Z is the vertical direction. In this instance, the direction Y is perpendicular to the plane of the page and has not been represented.

Terms such as "upper", "lower", "above", "below" and the like are defined with respect to the direction Z.

The expression "an element that extends mainly horizontally" means that the element extends mainly along a plane that forms an angle with a horizontal plane of less than 25° and, preferably, less than 10° or 5°.

The expression "an element that extends mainly vertically" means that the element extends mainly along a plane that forms an angle with the vertical direction Z of less than 45° and, preferably, less than 25° or 10°.

Hereinafter, the expression "an element made from X" or "element made of X" or "X element" means that at least 90% of the weight of this element and preferably at least 95% or 98% of the weight of this element is formed by the material X.

The term "superconducting" denotes a material the conductance of which is infinite when its temperature is lower than a critical temperature greater than 0 K and, preferably, greater than 1 K or 5 K or 10 K. The critical temperature denotes the temperature of the superconducting material below which its resistivity is zero or practically zero.

The term "non-superconducting" denotes a material that is not superconducting.

The expression "electrically conductive material" denotes a material the electrical conductivity of which at 20° C. is greater than 103 S/m and preferably greater than 105 S/m.

An electrically insulating material is a material the electrical conductivity of which at 20° C. is less than $10^{-7}$ or $10^{-11}$ S/m.

In this text, the term "vanadium silicide" denotes the material having the chemical formula $V_3Si$ and not the material having the chemical formula $VSi_2$.

Section II—Exemplary Embodiments:

FIG. 1 shows a Josephson field-effect transistor 2, better known by the acronym JoFET. Such transistors are for example used to manufacture quantum computers.

The transistor 2 comprises a source 8, a drain 10 and a gate 12. In this instance, the source 8 and the drain 10 are arranged, along the direction X, respectively, to the left and to the right of the gate 12. In this exemplary embodiment, the source 8 and the drain 10 are structurally identical. Thus, only the structure of the source 8 is described in detail further below with reference to FIG. 2.

The gate 12 is produced on the upper face of a semiconductor layer 14. The gate 12 extends vertically from the upper face of the layer 14 to an upper face located on the side opposite the layer 14.

To simplify FIG. 1, only the following elements of the gate 12 have been depicted:
- a thin layer 16 of electrically insulating material in direct contact with the upper face of the layer 14,
- a body 17 made of semiconductor material deposited directly on the layer 16, and
- side spacers 18 and 20 arranged on vertical faces of the body 17 in order to electrically isolate the source 8 and the drain 10.

Typically, in addition to the above elements, the gate 12 may comprise a thin metal layer between the layer 16 and the body 17.

The layer 16 is for example made of silicon oxide or of silicate.

The body 17 extends to the upper face of the gate 12. The body 17 is in this instance made of polycrystalline silicon.

The spacers 18 and 20 are made from an electrically insulating material, such as for example silicon nitride or an oxide such as silicon oxide.

The upper face of the layer 14 extends in an upper plane $P_{sup14}$. The layer 14 also comprises a lower face that extends in a lower plane $P_{inf14}$. The plane $P_{inf14}$ is located level with the interface between the layer 14 and a layer 22 of electrically insulating material located under this layer 14.

The thickness $e_{14}$ of the layer 14 is equal to the vertical distance between the planes $P_{inf14}$ and $P_{sup14}$. The thickness $e_{14}$ is generally between 5 nm and 500 nm and preferably between 5 nm and 50 nm. In this instance, the thickness $e_{14}$ is between 7 nm and 30 nm.

The region of the layer 14 located under the gate 12 and between the source 8 and the drain 10 is called "channel". The ends of this channel are electrically connected, respectively, to the source 8 and to the drain 10. The length of the channel in the direction X between its ends in mechanical and electrical contact with the source 8 and the drain 10 is typically greater than 5 nm or 500 nm. In this instance, the length of the channel is between 20 nm and 100 nm.

The layer 22 is typically made of silicon oxide. Its thickness is for example between 1 nm and 100 nm.

The layer 22 rests directly on a support 24 that stiffens the various layers stacked on top. For example, the thickness of the support 24 is greater than 10 μm and, typically, greater than 500 μm or 750 μm. In this instance, the support 24 is made of silicon such as monocrystalline, amorphous or polycrystalline silicon. Typically, the support 24 and the layers 22 and 24 originate from the various layers of an SOI (Silicon On Insulator) substrate.

In order to isolate the transistor 2 from other transistors fabricated in parallel on the same support 24, deep isolation trenches 26 and 28 are produced around the transistor 2. These trenches 26 and 28 are known by the acronym STI (Shallow Trench Isolation). They are made from an electrically insulating material, such as silicon oxide or silicon nitride and silicon oxide. The depth of the trenches 26 and 28 is typically of the order of 250 nm. Thus, the depth of these trenches is generally between 200 nm and 300 nm. The term "depth of the trenches 26 and 28" denotes in this instance the greatest dimension of the trenches 26 and 28 in a direction perpendicular to the plane in which the support 24 mainly extends.

The upper face of the layer 14 is covered by a thin layer 30 of electrically insulating material. For example, the layer 30 is made of silicon nitride. Its thickness is generally between 2 nm and 50 nm. This layer 30 in this instance also covers the vertical flanks of the gate 12 along with part of its upper face.

The source 8, the drain 10 and the gate 12 are encapsulated in an encapsulation layer 32. The layer 32 has an upper face that extends in an interconnection plane $P_{int}$.

The plane $P_{int}$ is horizontal and located, in this embodiment, above the upper face of the gate 12 and above the portion of the layer 30 that covers part of the upper face of the gate 12. To simplify FIGS. 1, 2 and 12, the remainder of the layer 32 that generally covers the portion of the layer 30 located above the gate 12 has not been shown. The layer 32 is made from an electrically insulating material. For example, it is made of silicon oxide.

Electrical contact outlets 40, 42 are formed on the upper face of the layer 32 for electrically connecting, respectively, the source 8 to a first electrical potential and the drain 10 to a second electrical potential. The first and second electrical potentials may be equal.

In this embodiment, the outlets 40 and 42 are structurally identical, and only the structure of the outlet 40 is described in more detail. The outlet 40 extends from the plane $P_{int}$ to an outer plane $P_{ext}$ beyond which the electrical connections that connect the source 8, the drain 10 and the gate 12 to electrical potentials are formed. The plane $P_{ext}$ extends horizontally.

The outlet 40 comprises:
a body 46 made of non-superconducting material, and
an outer coating 48 made of superconducting material.

The coating 48 electrically connects the source 8 to the plane $P_{ext}$. To this end, the coating 48 covers the various faces of the body 46 that are located between the planes $P_{int}$ and $P_{ext}$. More precisely, the coating 48 in this instance extends along the plane $P_{int}$ from a location where the source 8 is located flush in this plane $P_{int}$. The coating 48 is thus in direct mechanical and electrical contact with the source 8.

The coating 48 also covers side faces of the body 46 that extend mainly vertically to the plane $P_{ext}$. In addition, in this instance, the coating 48 prevents the material used to form the body 46 from reacting with the encapsulation material of a layer 52. For example, the coating 48 is made of titanium nitride (TIN). In addition to being a superconducting material, titanium nitride does not react chemically with the material of the layer 52.

The body 46 is preferably made of electrically conductive material. In this instance, it is made of tungsten.

The outlets 40 and 42 are encapsulated inside a dielectric layer 52. In this embodiment, the layer 52 is separated from the layer 32 by a thin layer 50 of electrically insulating material. The layer 52 extends vertically from the layer 50 to the plane $P_{ext}$. In this instance, the layer 52 is made of silicon oxide.

The transistor 2 also comprises an electrical contact outlet 60 that makes it possible to electrically connect the gate 12 to an electrical potential via an electrical connection located beyond the plane $P_{ext}$.

In this instance, the structure of the outlet 60 is similar to the structure of the outlet 40. It therefore comprises in particular:
a body 62 made of non-superconducting material, and
a coating 64 made of superconducting material.

The coating 64 extends in particular along the upper face of the gate 12 so as to ensure mechanical and electrical contact between the body 17 and the outlet 60. The coating 64 also passes through the layers 50 and 52 so as to be located flush in the plane $P_{ext}$. For example, the body 62 is made of tungsten.

FIG. 2 shows the structure of the source 8 in more detail. The source 8 comprises:
a superconducting electric charge reservoir 70,
side flanks 72 for electrically connecting the reservoir 70 to the outlet 40, and
a body 74 housed on the reservoir 70 and between the side flanks 72.

The reservoir 70 is made of superconducting material. In this instance, it is made of vanadium silicide. This reservoir 70, in combination with the channel and the corresponding reservoir of the drain 10, forms a Josephson junction. To this end, the reservoir 70 is in this instance located at the left-hand end of the channel. In addition, the reservoir 70 is sunk at least partially inside the layer 14.

More precisely, the reservoir 70 comprises:
a lower face 76, and
side faces buried inside the layer 14.

The lower face 76 extends in a horizontal plane $P_{i14}$. The plane $P_{i14}$ is located between the planes $P_{inf14}$ and $P_{sup14}$ of the layer 14. More precisely, the vertical distance between the planes $P_{i14}$ and $P_{sup14}$ is between $0.25e_{14}$ and $0.9e_{14}$ and, preferably, between $0.5e_{14}$ and $0.75e_{14}$, $e_{14}$ being the distance between the planes $P_{inf14}$ and $P_{sup14}$.

The side faces of the reservoir 70 extend mainly vertically from the lower face 76 to the plane $P_{sup14}$. Among these side faces, one of them, designated by the reference numeral 78, faces a corresponding side face of the reservoir of the drain 10. This side face 78 is separated from this corresponding side face of the drain 10 exclusively by the channel formed in the layer 14 and that mechanically and electrically connects these two reservoirs. The thickness of the reservoir 70 is typically between nm and 400 nm and preferably between 10 nm and 100 nm or between 10 nm and 60 nm. The thickness of the reservoir 70 is equal to the smallest vertical distance between the lower face 76 and the interface between the reservoir 70 and the body 74.

The side flanks 72 extend the side faces of the reservoir 70 to the plane $P_{int}$. To this end, the side flanks 72 extend mainly vertically through the layers 30 and 32. Thus, the upper end of these side flanks 72 is located flush with the plane $P_{int}$. The side flanks 72 are made of superconducting material. In this instance, they are made from the same superconducting material as the one used to produce the reservoir 70. Thus, in this embodiment, the side flanks 72 and the reservoir 70 form just a single integral block of material.

The body 74 is located on the reservoir 70 and between the side flanks 72. It extends from the reservoir 70 to the plane $P_{int}$. It therefore completely fills the space located between the side flanks 72. The body 74 is made from a non-superconducting material. In this instance, it is made from an electrically insulating material. For example, it is made of silicon oxide. The body 74 is made of electrically insulating material since the electrical connection of the reservoir 70 to the outlet 40 is achieved exclusively by way of the side flanks 72 made of superconducting material.

A method for fabricating the transistor 2 will now be described with reference to FIG. 3 and with the aid of FIGS. 4 to 12.

In a step 110, the stack shown in FIG. 4 is produced from an SOI substrate so as to form the support 24 and the layers 22 and 14. Next, the gate 12 is fabricated by etching various successive layers deposited on the upper face of the layer 14. The various operations for obtaining the stack shown in FIG. 4, starting from an SOI substrate, are known. Thus, step 110 is not described in more detail.

In a step 130, the layers 30 and 32 are deposited successively on one another in order to completely encapsulate the gate 12. Next, the upper face of the layer 32 is polished in order to obtain the state shown in FIG. 5. The polishing is stopped before reaching the portion of the layer 30 located on the gate 12. A thickness of the layer 32 above this gate thus remains. For example, the polishing method employed is a chemical-mechanical polishing method known by the acronym CMP.

In a step 140, holes 142 and 144 (FIG. 6) are hollowed out on either side of the gate 12 at the locations where the source 8 and the drain 10, respectively, are to be produced. At this stage, the holes 142 and 144 each open out directly onto the upper face of the layer 14. For this purpose, typically, a first operation of etching the layer 32 through an etching mask is performed. This first etching operation is stopped when the layer 30 is exposed. Next, a second operation of etching the layer 30 is employed so that the bottom of the holes 142 and 144 open out directly onto the upper face of the layer 14. These first and second etching operations are performed with different etchants since the materials of the layers 30 and 32 are different. At the end of step 140, portions of the upper face of the layer 14 that are located at the bottom of the holes 142 and 144 are therefore exposed.

In a step 150, the exposed portions of the upper face of the layer 14 are etched so as to hollow out two cavities 152 and 154 (FIG. 7) in the layer 14. The cavities 152 and 154 form the lower ends, respectively, of the holes 142 and 144. The etching of the layer 14 is stopped before reaching the layer 22. In this instance, this etching is stopped when the depth of these cavities 152, 154 is between $0.5e_{14}$ and $0.75e_{14}$. The bottom of the cavities 152, 154 then extends mainly in the plane $P_{i14}$. The side faces of the cavities 152, 154 are located at the location of the side faces of the superconducting reservoirs.

In a step 160, a treatment of the inner faces of the cavities 152, 154 is carried out in order to prepare them to receive a deposition of vanadium silicide. In this instance, the preparation of the inner faces of the cavities 152, 154 consists in incorporating argon atoms 162 (FIG. 8) into these inner faces, and also in cleaning these inner faces in order in particular to deoxidize them.

Figure 8:
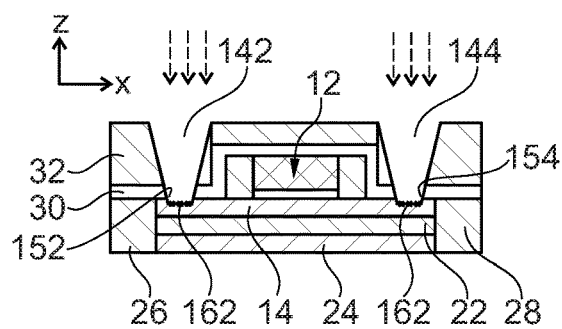
Figure 9:
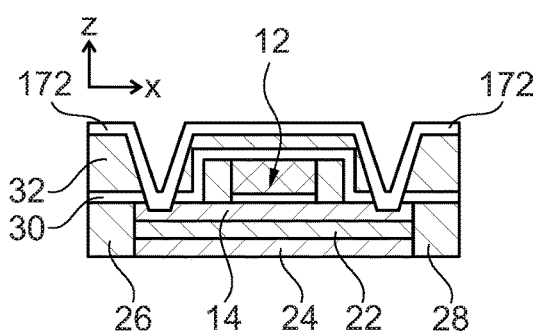
Figure 10:
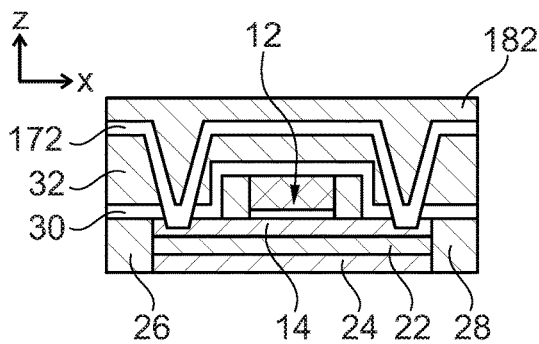

In FIG. 8, the argon atoms incorporated into the inner faces of the cavities 152, 154 are represented by crosses and designated by the same common reference 162. The majority of the argon atoms incorporated into these inner faces are located less than 10 nm and preferably less than 5 nm from the surface of these cavities 152, 154. They are therefore located inside a thin surface layer less than 10 nm and preferably less than 5 nm thick. The thickness of this thin surface layer is also generally greater than 1 nm. Advantageously, 70% or 80% or even 90% by weight of the argon atoms incorporated into the layer 14 are located inside this thin surface layer. The concentration of argon atoms incorporated into this thin surface layer is between 1 atom % and 10 atom % and preferably between 2 atom % and 5 atom %. The expression "X atom %" means that the number of argon atoms inside the thin surface layer represents X % of the total number of atoms present in this surface layer. In this text, the expression "incorporate argon atoms into the inner faces of the cavities" means to incorporate the argon atoms inside the thin surface layer with a concentration within the above concentration ranges.

In this instance, in order to incorporate the argon atoms into the inner faces of the cavities 152, 154 and at the same time to clean these inner faces, the upper part of the transistor in the course of fabrication is subjected to an argon plasma cleaning operation. During this operation, the upper face is directly exposed to an argon plasma. This plasma comprises argon ions. The transistor and the plasma are at different potentials so that the argon ions are projected onto the transistor. Projected argon ions penetrate into the holes 142 and 144 and strike the inner faces of the cavities 152, 154.

They then penetrate slightly into these inner faces and are then transformed into argon atoms. In FIG. 8, the projection of the argon ions onto the inner faces of the cavities 152, 154 is represented by vertical dotted arrows.

In order to regulate the amount of argon ions projected onto the inner faces of the cavities 152, 154, there are mainly two parameters to be regulated for a given potential difference:

the partial argon pressure in the plasma, and
the concentration of argon irons in the plasma.

The partial pressure may be regulated by adjusting the flow rate of argon gas entering and leaving the reservoir containing the argon plasma.

The concentration of argon ions in the plasma may be adjusted by modifying the power of the alternating current that flows in an antenna that transforms this alternating current into an alternating electric field present inside the reservoir. It is this alternating electric field that transforms the inert argon gas into argon plasma. This power is known by the term "RF power". In this instance, the partial pressure and the RF power are regulated in order to obtain the desired concentration of argon atoms inside the thin surface layer in the cavities 152, 154.

By way of example, a CT200 device produced by Alliance Concept® was used. In order to obtain the desired concentration of argon atoms at the surface of the layer 14 with this device, the partial pressure is chosen between 0.001 mbar (0.1 Pa) and 0.15 mbar (15 Pa) and the RF power is chosen between 100 W and 400 W. For example, a pressure equal to 0.05 mbar (5 Pa) and an RF power equal to 200 W were used.

In a step 170, a layer 172 (FIG. 9) of vanadium silicide is deposited on the upper face of the transistor in the course of fabrication. Once deposited, this layer 172 covers the portions of the upper face of the transistor that extend horizontally, the side walls of the holes 142, 144 and the bottom of the cavities 152, 154. Thus, at the bottom of each hole 142 and 144, this gives a stack of a vanadium silicide layer deposited directly on the silicon layer 14. The thickness of the deposited layer 172 is equal to the thickness of the reservoir 70. In this embodiment, its thickness is not enough to completely fill the holes 142 and 144. Thus, at the end of step 170, there remain two cavities located at the locations intended to receive the bodies 74, respectively, of the source 8 and of the drain 10.

The deposition of vanadium silicide is carried out using the physical vapor deposition method known by the acronym PVD. For example, for this purpose, a vanadium silicide target is bombarded with argon ions, which tears off atoms at the target. The atoms thus torn off will subsequently be deposited on the upper face of the transistor in the course of fabrication. The layer 172 is thus deposited gradually.

At this stage, the deposited layer 172 is amorphous or only partially crystalline. Thus, at this stage, the vanadium silicide is not yet superconducting or its critical temperature is low and may still be improved.

In a step 180, a layer 182 (FIG. 10) is deposited in order to completely fill the cavities located at the locations of the bodies 74 of the source 8 and of the drain 10.

For this purpose, the layer 182 is made from the same material as that of the body 74.

Figure 11:
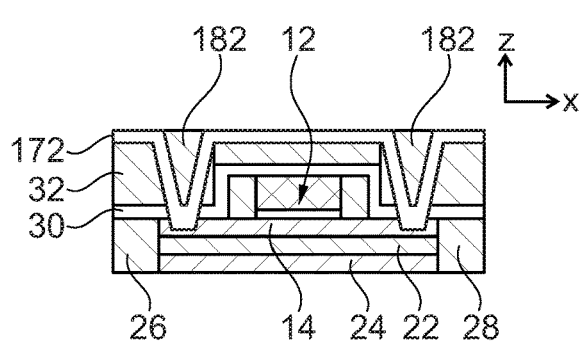

In a step 190, the upper face of the layer 182 is polished until reaching the layer 172 (FIG. 11). For example, this involves simple mechanical polishing. At the end of step 190, the layer 182 remains only inside the holes 142, 144.

In a step 200, another polishing operation is employed to remove the portions of the layer 172 that are located outside the holes 142, 144. This polishing is stopped when the portion of the layer 30 located above the gate 12 is reached (FIG. 12). At the end of step 200, the source 8 and the drain 10 are obtained.

In a step 210, a heat treatment is applied in order to heat the deposited vanadium silicide and thus increase its critical temperature in order, typically, to obtain a critical temperature greater than 10 K and, preferably, greater than 15 K or 16 K or 17 K. For this purpose, this heat treatment crystallizes the vanadium silicide deposited in step 170.

This heat treatment consists in placing the transistor in an oven preheated to a predetermined temperature TF between 200° C. and 1100° C. and, preferably, between 500° C. and 900° C.

Next, the transistor is left in this oven for a duration DF between 10 s and 15 min and, preferably, between 10 s and 5 min and even more preferably between 10 s and 120 s or between 30 s and 60 s. Typically, the higher the temperature TF, the more the duration DF may be reduced. However, an excessively high temperature TF may melt other layers of the transistor, such as the support 24, and therefore damage it. Thus, an acceptable compromise has to be found between a high temperature TF and a short duration DF. An acceptable compromise is for example to choose the temperature TF between 500° C. and 900° C. and the duration DF between 30 s and 60 s.

For example, in step 210, the heat treatment is a rapid thermal annealing, better known by the acronym RTA.

In step 210, the argon atoms incorporated into the inner faces of the cavities 152, 154 prevent the deposited vanadium silicide from reacting with the silicon of the layer 14 to form $VSi_2$. $VSi_2$ is a non-superconducting material, and its presence at the interface between the reservoir 70 and the silicon channel degrades performance on the fabricated transistor. In this instance, by virtue of step 160, the formation of $VSi_2$ is eliminated or very greatly reduced. This is important for example in order to obtain a good Josephson junction.

Finally, in a step 220, the outlets 40, 42 and 60 are produced. For example, for this purpose, the layers 50 and 52 are deposited successively. Next, openings are produced in the layers 50, 52 and 30 at the locations where the outlets 40, 42 and 60 are to be produced. A thin layer of superconducting material is then deposited. This thin layer is made from the same material as the coatings 48 and 64 and covers all of the walls of the openings that are produced. A layer of non-superconducting material is then deposited. The thickness of this layer is enough to completely fill the openings that are produced. This layer is made from the same material as that of the bodies 46 and 62. Finally, the upper face of the transistor is polished to remove portions of the deposited layers that extend outside of the openings that are formed. The outlets 40, 42 and 60 are then obtained.

Section III—Variants:

Variants of the Source and Drain:

As a variant, the reservoir 70 is not completely buried inside the layer 14. Thus, according to this variant, the reservoir 70 comprises a lower part located below the plane $P_{sup14}$ and an upper part located above the plane $P_{sup14}$.

The vanadium silicide used to produce the reservoir 70 may be replaced with other superconducting materials. In particular, other superconducting silicides may be used instead of vanadium silicide. For example, the following silicides are suitable: CoSi2 and PtSi. Although they are used less often, the following silicides may also be suitable: PdSi, RhSi, $LaSi_2$ and $CaSi_2$. Other superconducting materials that are not silicides may also be used instead of vanadium silicide, such as for example $Nb_3Ge$, titanium nitride, tantalum nitride and aluminum.

The reservoir 70 may also be formed by a stack of multiple superconducting materials. For example, the reservoir 70 comprises a vanadium silicide body covered with a titanium nitride coating. In this case, the titanium nitride coating is interposed between the vanadium silicide body and the silicon of the layer 14. In such a case, the thickness of the coating is small compared to the thickness of the body. For example, the coating thickness is less than 5 nm or 10 nm. In such an embodiment, the vanadium silicide is mechanically isolated from the silicon of the layer 14 by the titanium nitride coating. The step 160 of incorporating argon atoms may then be omitted. Indeed, in heat treatment step 210, the vanadium silicide does not react with the silicon of the layer 14 due to the presence of this titanium nitride coating.

In another embodiment, the reservoir 70 is not in direct contact with the material of the layer 14. For example, a thin layer of non-superconducting material may be deposited on the inner faces of the cavities 152, 154 before the deposition of the superconducting material. For example, this thin layer is made from a semiconductor material such as germanium. The thickness of this thin layer is less than 10 nm or 5 nm.

Other embodiments of the source 8 are possible. For example, as a variant, the body 74 is replaced with a body made of superconducting material. Preferably, in the latter case, the body is made from the same superconducting material as the one used to produce the reservoir 70. The source is thus formed only from a single block of superconducting material. The body 74 may also be made from a dielectric material. By contrast, preferably, the body 74 is not made of non-superconducting metal.

In another variant, the side flanks 72 are omitted and the body 74 is replaced with a body made of electrically conductive and non-superconducting material that occupies the location of the side flanks 72 and the location of the body 74. In the latter case, the reservoir 70 is electrically connected to the outlet 40 only via this body made of electrically conductive and non-superconducting material. For example, in such a case, the body is made of tungsten.

As a variant, the structure of the drain 10 is not the same as the structure of the source 8. For example, one of the source 8 and the drain 10 is produced in accordance with one of the variants described in the previous paragraph for the source 8.

The source 8 and/or the drain 10 may be common to two transistors produced next to one another.

The source 8, the drain 10 and the gate 12 are not necessarily aligned behind one another in the direction X. For example, as a variant, the gate 12 also comprises a larger part offset in the direction Y with respect to the access along which the source 8 and the drain 10 are aligned.

As a variant, the upper face of the gate 12 extends in the plane $P_{int}$.

Other Variants of the Transistor:

The body 17 of the gate 12 may also be produced by a stack of metals or of alloy having or not having superconducting properties.

The layer 14 may be made from a semiconductor material other than silicon. Preferably, the layer 14 is made of semiconductor material or from an alloy of semiconductor materials chosen from the group consisting of silicon and germanium or their alloy. However, other semiconductor materials may also be suitable, such as for example an InAs or $Mo_3Ge$ alloy or other semiconductor materials from group III-V.

The bodies 46 and 62 may be made from materials other than tungsten. In particular, they may also be made from other metals such as aluminum, titanium nitride or copper. They may also be made from materials that are not electrically conductive materials. Indeed, since the coatings 48 and 62 are made of superconducting materials, most of the electric charge propagates inside these coatings and not inside the bodies 46 and 62. For example, as a variant, the bodies 46 and 62 are made of electrically insulating material such as silicon oxide.

In another variant, the bodies 46 and/or 62 are also made from a superconducting material. In this case, the outer coatings 48 and 64 may be omitted.

In another embodiment, the outer coatings 48 and 64 are made of non-superconducting material.

Depending on the application intended for the transistor 2, some of the outlets 40, 42 and 60 may be omitted. For some applications, the outlet 60 may be common to the gate of multiple transistors.

Variants of the Fabrication Method:

Plasma devices other than the one used by the applicant may be suitable for incorporating argon atoms at the surface of the layer 14. If another device is used, this has to be regulated in order to obtain the desired concentration of argon atoms at the surface of the layer 14. For example, such regulation may be determined experimentally by measuring, for various attempted regulations, each time the concentration of argon atoms at the surface of the layer 14. For example, the concentration of argon atoms at the surface of the layer 14 may be measured by emission spectrometry and in particular by inductively coupled plasma mass spectrometry, better known by the acronym ICP-MS. The concentration of argon atoms may also be measured by other appropriate methods, such as X-ray photoelectron spectrometry, better known by the acronym XPS.

Advantageously, the operation of treating the upper face of the layer 14 with an argon plasma is preceded by an operation of cleaning this upper face with hydrofluoric acid.

Other methods are possible for incorporating argon atoms at the surface of the silicon layer 14. For example, in another embodiment, the same method as the one used to implant dopants in a semiconductor material is used to implant argon atoms. In this case, the argon atoms are first ionized. Next, the argon ions that are obtained are accelerated by an electric field and then projected onto the upper face of the layer 14. The energy of the argon ions is regulated in order for the majority of these ions not to sink by more than 5 nm or 10 nm into the silicon layer. Thus, by way of example, the energy of the argon ions is between 5 and 15 keV. The dose necessary to obtain an atomic concentration of argon of between 1 atom % and 10 atom % is between $9 \times 10^{14}$ and $9 \times 10^{15}$ ions per square centimeter. In one specific example, the dose necessary to obtain an atomic concentration of Ar of 4 atom % is $3.6 \times 10^{15}$ ions per square centimeter under an energy of 10 keV. Once implanted in the silicon layer, the argon ions again become neutral argon atoms. Preferably, in this case, after the implantation of the argon atoms in the silicon layer, an operation of cleaning the upper face of the silicon layer is carried out in order to finalize its preparation for the deposition of the vanadium silicide. The aim of this cleaning is in particular to deoxidize the upper face of the silicon layer. For example, this involves HF cleaning, that is to say cleaning with hydrofluoric acid, or cleaning with a helium or argon plasma. When the argon plasma is only used to clean the face of the silicon layer, the partial pressure and the RF power do not need to be regulated as described above to incorporate argon atoms inside the silicon layer 14. For example, the argon partial pressure and/or the RF power are much lower.

To incorporate argon atoms at the surface of the silicon layer 14, it is also possible to expose the upper face of this layer to a neutral argon gas so that argon atoms are adsorbed on this upper face. Next, a heat treatment is applied in order to cause the adsorbed argon atoms to diffuse inside the silicon layer.

Methods other than the PVD method are possible for depositing the vanadium silicide on the layer 14. For example, the vanadium silicide may also be deposited on the layer 14 using other vapor deposition methods, such as the chemical vapor deposition method, better known by the acronym CVD. The vanadium silicide may also be deposited by employing an electrochemical deposition method.

As a variant, step 210 may be carried out at another time. For example, the heat treatment may also be carried out just after step 170 and before step 180 or before step 190 or before step 200.

If another superconducting material is used instead of vanadium silicide or if the channel 14 is made from a semiconductor material other than silicon, step 160 of incorporating argon atoms may be omitted.

Other methods for forming the reservoir 70 made of superconducting material are possible. For example, the method described in application US2020287119A1, which consists in depositing pure vanadium on silicon and then in making it react with the silicon to form vanadium silicide, may be used. In this case, preferably, the thickness $e_{si}$ of the silicon layer and the thickness $e_v$ of the deposited pure vanadium layer are chosen so as to obtain the correct stoichiometric ratio between the number of vanadium atoms and the number of silicon atoms so as to promote the occurrence of vanadium silicide with the composition $V_3Si$ and limit the occurrence of $VSi_2$. For example, the thicknesses $e_{si}$ and $e_v$ may be calculated using the following proportionality relationship: a 1 nm thickness of vanadium+a 0.48 nm thickness of silicon forms a 1.26 nm thickness of $V_3Si$. The method described in this paragraph for forming vanadium silicide may also be used to form other superconducting materials, such as $Nb_3Ge$. For example, in the case of other silicides having the general formula $M_xSi_y$, the thickness $e_{si}$ of the silicide layer to be reacted with a 1 nm-thick layer of the element M may be determined using the following generic proportionality relationship: a 1 nm thickness of the element M+an $e_{si}$ nm thickness of silicon forms an $e_{MxSiy}$ nm thickness of the silicide $M_xSi_y$, where:

$e_{Si}$ is equal to $xV_{Si}/yV_M$, $e_{MxSiy}$ is equal to $V_{MxSiy}/V_M$, $V_{Si}$ is the atomic volume occupied by a silicon atom in its crystalline lattice, $V_M$ is the atomic volume occupied by an atom of the element M in its crystalline lattice, $V_{MxSiy}$ is the atomic volume occupied by an atom of the silicide $M_xSi_y$ in its crystalline lattice, x and y are the numbers of atoms, respectively, of silicon and of the element M in the silicide $M_xSi_y$.

Thus, using this generic relationship, it is determined that:

a 1 nm thickness of palladium+a 1.32 nm thickness of silicon forms a 1.97 nm thickness of PdSi, a 1 nm thickness of platinum+a 1.35 nm thickness of silicon forms a 1.98 nm thickness of PtSi, a 1 nm thickness of cobalt+a 3.64 nm thickness of silicon forms a 3.52 nm thickness of $Co_2Si$, a 1 nm thickness of tantalum+a 2.21 nm thickness of silicon forms a 2.40 nm thickness of $TaSi_2$.

Replacing the incorporation of argon atoms with the deposition, on a silicon layer, of a coating made of superconducting material other than vanadium silicide in order to prevent the vanadium silicide from reacting with the silicon during the heat treatment in step 210 may be employed in any method for fabricating a stack of a superconducting vanadium silicide layer on a silicon layer. In particular, this method for fabricating such a stack may be used in methods for fabricating components other than a transistor or else in a method for fabricating a Josephson transistor in which step 150 of etching the cavities 152, 154 is omitted.

Section IV—Advantages of the Described Embodiments:

It has been observed that sinking the reservoir 70 into the layer 14 improves the performance of the Josephson transistor. In particular, this facilitates the occurrence of the Josephson effect. The density of the critical current starting from which this effect occurs is therefore reduced. At present, this improvement in the performance of the transistor 2 is explained by the fact that sinking the reservoir 70 into the layer 14 makes it possible to obtain a side face 78 that faces a corresponding side face of the reservoir of the drain. This sinking also makes it possible to increase the surface area of the interface between the reservoir 70 and the layer 14. This increase in the interface surface area is in particular due to the fact that the lower face 76 of the reservoir is separated from the plane $P_{inf14}$ by a thickness of silicon.

Raising the superconducting material up to the interconnection plane $P_{int}$ makes it possible to increase tolerance with regard to the positioning of the contact outlets for the source 8 and the drain 10. Indeed, since the material with which the outlet establishes electrical contact is a superconducting material, the surface area of the electrical contact between the outlet and this superconducting material has little influence on the resistivity of this electrical contact. It is therefore possible to arrange the outlet 40 so as to straddle, as shown in the previous figures, an edge of the source without this having consequences on the operation of the transistor.

With identical resistivity, the fact that the source comprises the body 74 made of non-superconducting material located between the side flanks 72 makes it possible to limit the amount of superconducting materials used to fabricate the source. In particular, the resistivity of the source 8 is identical to the case of a source made entirely of superconducting material.

The fact that the outlet 40 comprises a superconducting coating makes it possible to decrease the resistivity of this outlet. In addition, using a non-superconducting material to form the body 46 of the outlet 40 makes it possible to limit the amount of superconducting material used to produce such an outlet.

Directly depositing vanadium silicide on the silicon layer is advantageous in comparison with the method that deposits only vanadium on the silicon layer and then subsequently transforms this deposited vanadium into vanadium silicide using a heat treatment. First of all, the method described here makes it possible to deposit vanadium and silicon in the desired stoichiometric proportions in order to obtain vanadium silicide.

There is therefore no waste of material, such as for example an excessively great deposition of vanadium. Deposition of vanadium silicide is easier to perform than deposition of pure vanadium, since vanadium silicide is less sensitive to oxidization. The heat treatment applied in step 210 of the method described here to increase the critical temperature of the vanadium silicide takes place at a temperature that is generally smaller than that necessary to cause pure vanadium deposited on the silicon layer to react in order to obtain vanadium silicide. Furthermore, the duration of this heat treatment is shorter. Finally, it is easier to control the thickness of vanadium silicide that is deposited by employing the method described here than in the case where the vanadium silicide is obtained by a chemical reaction between pure vanadium and a silicon layer. Indeed, this chemical reaction consumes a portion of the silicon layer and therefore modifies the thickness of the vanadium layer.

The use of an argon plasma makes it possible, in a single operation, to clean the upper face of the silicon layer 14, to prepare it for the deposition of vanadium silicide, and, at the same time, to incorporate the argon atoms at the surface of this silicon layer.

The deposition of vanadium silicide using the PVD method is easy to perform.

The invention claimed is:

1. A Josephson transistor, this transistor comprising:
   a stack comprising, in order:
      a support that extends mainly parallel to a plane-called plane of the support,
      a layer of electrically insulating material,
      a semiconductor layer produced directly on the layer of electrically insulating material, the semiconductor layer having:

an upper face that extends in an upper plane parallel to the plane of the support, and a lower face that extends in a lower plane parallel to the plane of the support, the lower face being located level with an interface between the semiconductor layer and the layer of electrically insulating material, a gate located on the upper face of the semiconductor layer, a region of the semiconductor layer located under the gate being a channel, and a source and a drain, each comprising an electric charge reservoir in electrical contact with the semiconductor layer of the stack, the reservoirs each being located at a respective end of the channel, being made from a superconducting material, and forming, with the channel, a Josephson junction, wherein each reservoir comprises a lower face and a side face both buried inside the semiconductor layer, the lower face of each reservoir extends mainly in an intermediate plane parallel to the plane of the support, the intermediate plane being located between the lower plane and the upper plane of the semiconductor layer, the side face of each reservoir extends mainly perpendicular to the plane of the support, the side face facing a corresponding side face of the other reservoir and being separated from the corresponding side face of the other reservoir by the channel, and a distance between the intermediate plane and the upper plane is between $0.25e_{14}$ and $0.9e_{14}$, where $e_{14}$ is equal to a distance between the upper plane and the lower plane.

2. The transistor as claimed in claim 1, wherein:

the gate comprises an upper face facing the side opposite the channel, the upper face being located flush with an interconnection plane or being located below the interconnection plane, the interconnection plane being parallel to the plane of the support, and the superconducting material of the reservoir of an electrode of the transistor rises until being located flush with the interconnection plane, the electrode of the transistor being chosen from a group consisting of the source and the drain of the transistor.

3. The transistor as claimed in claim 2, wherein the transistor comprises an electrical contact outlet for electrically connecting the electrode to an electrical potential, the contact outlet being formed on the interconnection plane and in direct mechanical and electrical contact with the superconducting material that is located flush with the interconnection plane.

4. The transistor as claimed in claim 2, wherein the electrode of the transistor comprises:

side flanks that extend from the reservoir of the electrode to the interconnection plane, the side flanks being located in the extension of side faces of the reservoir and forming just a single block of superconducting material with the reservoir, and a body made of non-superconducting material, located on the reservoir and between the side flanks.

5. The transistor as claimed in claim 3, wherein the contact outlet comprises:

a body made of non-superconducting material, and an outer coating made of superconducting material that at least partially surrounds the body made of non-superconducting material, the outer coating extending from the superconducting material of the electrode that is located flush with the interconnection plane to an upper face of the contact outlet.

6. The transistor as claimed in claim 1, wherein the distance between the intermediate plane and the upper plane is between $0.5e_{14}$ and $0.75e_{14}$.

7. The transistor as claimed in claim 1, wherein the distance $e_{14}$ is between 7 nm and 30 nm.

8. The transistor as claimed in claim 1, wherein the semiconductor layer is made from a semiconductor material or from an alloy of semiconductor materials chosen from a group consisting of silicon and germanium.

9. A method for fabricating a Josephson transistor, the method comprising:

producing a stack comprising, in order:

a support that extends mainly parallel to a plane of the support, a layer of electrically insulating material, a semiconductor layer produced directly on the layer of electrically insulating material, the semiconductor layer having:

an upper face that extends in an upper plane parallel to the plane of the support, and a lower face that extends in a lower plane parallel to the plane of the support, the lower face being located level with an interface between the semiconductor layer and the layer of electrically insulating material, a gate located on the upper face of the semiconductor layer, a region of the semiconductor layer located under the gate being a channel, producing a source and a drain, each comprising an electric charge reservoir in electrical contact with the semiconductor layer of the stack, these the reservoirs each being located at a respective end of the channel, these the reservoirs being made from a superconducting material and forming, with the channel, a Josephson junction, wherein the producing the source and the drain further comprises:

etching, into the semiconductor layer, at each end of the channel, a first and a second cavity, each of the first and second cavities having:

a bottom that extends mainly in an intermediate plane parallel to the plane of the support, the intermediate plane being located between the lower plane and the upper plane of the semiconductor layer, and side walls that extend mainly perpendicular to the plane of the support and one of the side walls facing a corresponding side wall of the other cavity and being separated from the corresponding side wall of the other cavity by the channel, and depositing a superconducting material on the bottom and the side walls of the first and second cavities to obtain the reservoirs of the drain and of the source.

10. The method as claimed in claim 9, wherein:

when producing the stack, the semiconductor layer is made of silicon, when depositing the superconducting material, the deposited superconducting material is vanadium silicide, wherein the method further comprises before the vanadium silicide is deposited, incorporating argon atoms into the bottom and the side walls of the first and second cavities, and applying a heat treatment is-applied to increase a critical temperature of the deposited vanadium silicide.

11. The method as claimed in claim 10, wherein the step of incorporating the argon atoms generates, inside the silicon layer, a thin surface layer inside which the concentration of argon atoms is between 1 atom % and 10 atom %.

* * * * *

UNITED STATES PATENT AND TRADEMARK OFFICE
CERTIFICATE OF CORRECTION

| | | |
|---|---|---|
| PATENT NO. | : 12,402,542 B2 | Page 1 of 1 |
| APPLICATION NO. | : 17/823330 | |
| DATED | : August 26, 2025 | |
| INVENTOR(S) | : Nemouchi et al. | |

It is certified that error appears in the above-identified patent and that said Letters Patent is hereby corrected as shown below:

On the Title Page

Column 2, item (57), in "Abstract", Line 5, delete "The" and insert -- the --, therefor.

In the Claims

In Column 12, Claim 1, Line 60, delete "this transistor comprising:" and insert -- comprising: --, therefor.

In Column 12, Claim 1, Line 62, delete "to a plane-called" and insert -- to a --, therefor.

In Column 14, Claim 9, Line 31, delete "these the" and insert -- the --, therefor.

In Column 14, Claim 9, Line 33, delete "these the" and insert -- the --, therefor.

In Column 14, Claim 10, Line 59, delete "comprises" and insert -- comprises: --, therefor.

In Column 14, Claim 10, Line 63, delete "is-applied to" and insert -- to --, therefor.

Signed and Sealed this
Third Day of February, 2026

John A. Squires
*Director of the United States Patent and Trademark Office*